(12) United States Patent
He et al.

(10) Patent No.: US 12,347,515 B2
(45) Date of Patent: Jul. 1, 2025

(54) CIRCUIT FOR TRACKING ACCESS OCCURRENCES

(71) Applicant: Micron Technology, Inc., Boise, ID (US)

(72) Inventors: Yuan He, Boise, ID (US); Jiyun Li, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 268 days.

(21) Appl. No.: 17/811,794

(22) Filed: Jul. 11, 2022

(65) Prior Publication Data

US 2024/0013816 A1    Jan. 11, 2024

(51) Int. Cl.
*G11C 7/08* (2006.01)
*G11C 7/10* (2006.01)
*G11C 7/12* (2006.01)

(52) U.S. Cl.
CPC .............. *G11C 7/08* (2013.01); *G11C 7/1069* (2013.01); *G11C 7/12* (2013.01)

(58) Field of Classification Search
CPC ........... G11C 7/08; G11C 7/1069; G11C 7/12; G11C 7/18; G11C 11/4094; G11C 11/4097
See application file for complete search history.

(56) References Cited

U.S. PATENT DOCUMENTS

| | | | |
|---|---|---|---|
| 5,471,430 A * | 11/1995 | Sawada | G11C 29/02 365/233.5 |
| 6,449,204 B1 * | 9/2002 | Arimoto | G11C 29/028 365/194 |
| 2009/0207642 A1 * | 8/2009 | Shimano | G11C 11/1675 365/72 |
| 2021/0089385 A1 * | 3/2021 | Basuta | G06F 12/10 |
| 2021/0090681 A1 * | 3/2021 | Harms | G11C 29/021 |

* cited by examiner

*Primary Examiner* — Mohammed A Bashar
(74) *Attorney, Agent, or Firm* — Holland & Hart LLP

(57) ABSTRACT

Methods, systems, and devices for circuit for tracking access occurrences are described. For instance, a memory device may include a memory array with column lines extending in a first direction and row lines extending in a second direction. The memory device may include a set of sense amplifiers adjacent to the memory array in the first direction, where a first subset of the set of sense amplifiers is coupled with the first set of column lines and a second subset of the set of sense amplifiers is coupled with the second set of column lines. The memory device may include a circuit adjacent to the set of sense amplifiers along the second direction, where the circuit is configured to increment, based on the access operation for the row line, a value including the logic states read by the second subset of the set of sense amplifiers.

20 Claims, 7 Drawing Sheets

CIRCUIT FOR TRACKING ACCESS OCCURRENCES

FIELD OF TECHNOLOGY

The following relates to one or more systems for memory, including circuit for tracking access occurrences.

BACKGROUND

Memory devices are widely used to store information in various electronic devices such as computers, user devices, wireless communication devices, cameras, digital displays, and the like. Information is stored by programming memory cells within a memory device to various states. For example, binary memory cells may be programmed to one of two supported states, often denoted by a logic 1 or a logic 0. In some examples, a single memory cell may support more than two states, any one of which may be stored. To access the stored information, a component may read (e.g., sense, detect, retrieve, identify, determine, evaluate) a stored state in the memory device. To store information, a component may write (e.g., program, set, assign) the state in the memory device.

Various types of memory devices exist, including magnetic hard disks, random access memory (RAM), read-only memory (ROM), dynamic RAM (DRAM), synchronous dynamic RAM (SDRAM), static RAM (SRAM), ferroelectric RAM (FeRAM), magnetic RAM (MRAM), resistive RAM (RRAM), flash memory, phase change memory (PCM), self-selecting memory, chalcogenide memory technologies, not-or (NOR) and not-and (NAND) memory devices, and others. Memory cells may be described in terms of volatile configurations or non-volatile configurations. Memory cells configured in a non-volatile configuration may maintain stored logic states for extended periods of time even in the absence of an external power source. Memory cells configured in a volatile configuration may lose stored states when disconnected from an external power source.

DETAILED DESCRIPTION

In some examples, an external device may attempt to exploit a memory device by performing a row hammer, in which the external device accesses the same row line (e.g., word line) multiple times within a short interval in order to adjust the contents of memory cells in row lines adjacent to or within a threshold proximity of the accessed row line. In some examples, the memory device may employ a probabilistic scheme to determine whether an external device is performing a row hammer on the memory device. However, the probabilistic scheme may fail to identify row hammer in some cases or may incorrectly identify that row hammer has occurred in other cases.

The present disclosure describes a scheme that enables the memory device to determine whether row hammer has occurred deterministically. For instance, a memory array of the memory device may include a set of column lines (e.g., digit lines) that are coupled for each row line with a respective set of memory cells that store a quantity of times that the row line has been accessed, where the memory array extends in a first direction and a second direction and each of the set of column lines extends in the first direction. Additionally, the memory device may include a set of sense amplifiers and a circuit (e.g., a counter) adjacent to the set of sense amplifiers along the second direction that is configured to increment the value of logic states read by the set of sense amplifiers from an accessed row line. If the value is above a threshold amount, the memory device may determine that row hammer is occurring. By determining the presence of row hammer deterministically, the memory device may be less likely to fail to identify that row hammer has occurred and/or may be less likely to incorrectly determine that row hammer has occurred.

Features of the disclosure are initially described in the context of systems and dies as described with reference to FIGS. 1 and 2. Features of the disclosure are described in the context of a memory array, a counting scheme, and counter schematics as described with reference to FIGS. 3 through 5B. These and other features of the disclosure are further illustrated by and described with reference to an apparatus diagram and flowcharts that relate to circuit for tracking access occurrences as described with reference to FIGS. 6 and 7.

Figure 1:
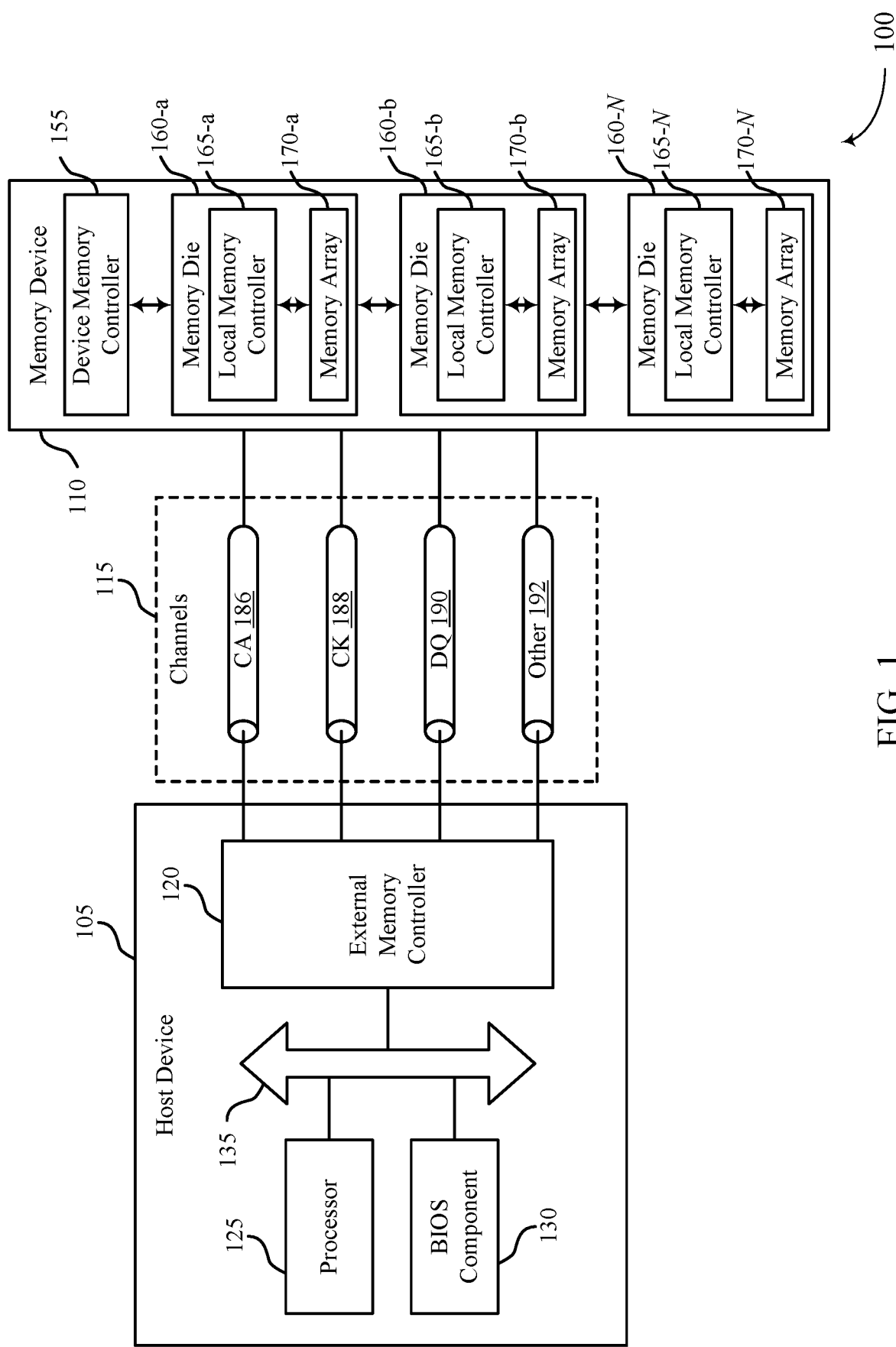
FIG. 1 illustrates an example of a system that supports a circuit for tracking access occurrences in accordance with examples as disclosed herein.

FIG. 1 illustrates an example of a system 100 that supports a circuit for tracking access occurrences in accordance with examples as disclosed herein. The system 100 may include a host device 105, a memory device 110, and a plurality of channels 115 coupling the host device 105 with the memory device 110. The system 100 may include one or more memory devices 110, but aspects of the one or more memory devices 110 may be described in the context of a single memory device (e.g., memory device 110).

The system 100 may include portions of an electronic device, such as a computing device, a mobile computing device, a wireless device, a graphics processing device, a vehicle, or other systems. For example, the system 100 may illustrate aspects of a computer, a laptop computer, a tablet computer, a smartphone, a cellular phone, a wearable device, an internet-connected device, a vehicle controller, or the like. The memory device 110 may be a component of the system 100 that is operable to store data for one or more other components of the system 100.

Portions of the system 100 may be examples of the host device 105. The host device 105 may be an example of a processor (e.g., circuitry, processing circuitry, a processing component) within a device that uses memory to execute processes, such as within a computing device, a mobile computing device, a wireless device, a graphics processing device, a computer, a laptop computer, a tablet computer, a smartphone, a cellular phone, a wearable device, an internet-connected device, a vehicle controller, a system on a chip (SoC), or some other stationary or portable electronic device, among other examples. In some examples, the host device 105 may refer to the hardware, firmware, software, or any combination thereof that implements the functions of an external memory controller 120. In some examples, the external memory controller 120 may be referred to as a host (e.g., host device 105).

A memory device 110 may be an independent device or a component that is operable to provide physical memory addresses/space that may be used or referenced by the system 100. In some examples, a memory device 110 may be configurable to work with one or more different types of host devices. Signaling between the host device 105 and the memory device 110 may be operable to support one or more of: modulation schemes to modulate the signals, various pin configurations for communicating the signals, various form factors for physical packaging of the host device 105 and the memory device 110, clock signaling and synchronization between the host device 105 and the memory device 110, timing conventions, or other functions.

The memory device 110 may be operable to store data for the components of the host device 105. In some examples, the memory device 110 (e.g., operating as a secondary-type device to the host device 105, operating as a dependent-type device to the host device 105) may respond to and execute commands provided by the host device 105 through the external memory controller 120. Such commands may include one or more of a write command for a write operation, a read command for a read operation, a refresh command for a refresh operation, or other commands.

The host device 105 may include one or more of an external memory controller 120, a processor 125, a basic input/output system (BIOS) component 130, or other components such as one or more peripheral components or one or more input/output controllers. The components of the host device 105 may be coupled with one another using a bus 135.

The processor 125 may be operable to provide functionality (e.g., control functionality) for the system 100 or the host device 105. The processor 125 may be a general-purpose processor, a digital signal processor (DSP), an application-specific integrated circuit (ASIC), a field-programmable gate array (FPGA) or other programmable logic device, discrete gate or transistor logic, discrete hardware components, or any combination of these components. In such examples, the processor 125 may be an example of a central processing unit (CPU), a graphics processing unit (GPU), a general purpose GPU (GPGPU), or an SoC, among other examples. In some examples, the external memory controller 120 may be implemented by or be a part of the processor 125.

The BIOS component 130 may be a software component that includes a BIOS operated as firmware, which may initialize and run various hardware components of the system 100 or the host device 105. The BIOS component 130 may also manage data flow between the processor 125 and the various components of the system 100 or the host device 105. The BIOS component 130 may include instructions (e.g., a program, software) stored in one or more of read-only memory (ROM), flash memory, or other non-volatile memory.

In some examples, the system 100 or the host device 105 may include various peripheral components. The peripheral components may be any input device or output device, or an interface for such devices, that may be integrated into or with the system 100 or the host device 105. Examples may include one or more of: a disk controller, a sound controller, a graphics controller, an Ethernet controller, a modem, a universal serial bus (USB) controller, a serial or parallel port, or a peripheral card slot such as peripheral component interconnect (PCI) or specialized graphics ports. The peripheral component(s) may be other components understood by a person having ordinary skill in the art as a peripheral.

In some examples, the system 100 or the host device 105 may include an I/O controller. An I/O controller may manage data communication between the processor 125 and the peripheral component(s) (e.g., input devices, output devices). The I/O controller may manage peripherals that are not integrated into or with the system 100 or the host device 105. In some examples, the I/O controller may represent a physical connection (e.g., one or more ports) with external peripheral components.

In some examples, the system 100 or the host device 105 may include an input component, an output component, or both. An input component may represent a device or signal external to the system 100 that provides information (e.g., signals, data) to the system 100 or its components. In some examples, and input component may include an interface (e.g., a user interface or an interface between other devices). In some examples, an input component may be a peripheral that interfaces with system 100 via one or more peripheral components or may be managed by an I/O controller. An output component may represent a device or signal external to the system 100 operable to receive an output from the system 100 or any of its components. Examples of an output component may include a display, audio speakers, a printing device, another processor on a printed circuit board, and others. In some examples, an output may be a peripheral that interfaces with the system 100 via one or more peripheral components or may be managed by an I/O controller.

The memory device 110 may include a device memory controller 155 and one or more memory dies 160 (e.g., memory chips) to support a capacity (e.g., a desired capacity, a specified capacity) for data storage. Each memory die 160 (e.g., memory die 160-a, memory die 160-b, memory die 160-N) may include a local memory controller 165 (e.g., local memory controller 165-a, local memory controller 165-b, local memory controller 165-N) and a memory array 170 (e.g., memory array 170-a, memory array 170-b, memory array 170-N). A memory array 170 may be a collection (e.g., one or more grids, one or more banks, one or more tiles, one or more sections) of memory cells, with each memory cell being operable to store one or more bits of data. A memory device 110 including two or more memory dies 160 may be referred to as a multi-die memory or a multi-die package or a multi-chip memory or a multi-chip package.

A memory die 160 may be an example of a two-dimensional (2D) array of memory cells or may be an example of a three-dimensional (3D) array of memory cells. In some examples, a 2D memory die 160 may include a single memory array 170. In some examples, a 3D memory die 160 may include two or more memory arrays 170, which may be stacked on top of one another or positioned next to one another (e.g., relative to a substrate). In some examples, memory arrays 170 in a 3D memory die 160 may be referred to as or otherwise include different sets (e.g., decks, levels, layers, dies). A 3D memory die 160 may include any quantity of stacked memory arrays 170 (e.g., two high, three high, four high, five high, six high, seven high, eight high). In some 3D memory dies 160, different decks may share a common access line such that some decks may share one or more of a word line, a digit line, or a plate line.

The device memory controller 155 may include components (e.g., circuitry, logic) operable to control operation of the memory device 110. The device memory controller 155 may include hardware, firmware, or instructions that enable the memory device 110 to perform various operations and may be operable to receive, transmit, or execute commands, data, or control information related to the components of the memory device 110. The device memory controller 155 may be operable to communicate with one or more of the external memory controller 120, the one or more memory dies 160, or the processor 125. In some examples, the device memory controller 155 may control operation of the memory device 110 described herein in conjunction with the local memory controller 165 of the memory die 160.

In some examples, the memory device 110 may communicate information (e.g., data, commands, or both) with the host device 105. For example, the memory device 110 may receive a write command indicating that the memory device 110 is to store data received from the host device 105, or receive a read command indicating that the memory device 110 is to provide data stored in a memory die 160 to the host device 105, among other types of information communication.

A local memory controller 165 (e.g., local to a memory die 160) may include components (e.g., circuitry, logic) operable to control operation of the memory die 160. In some examples, a local memory controller 165 may be operable to communicate (e.g., receive or transmit data or commands or both) with the device memory controller 155. In some examples, a memory device 110 may not include a device memory controller 155, and a local memory controller 165 or the external memory controller 120 may perform various functions described herein. As such, a local memory controller 165 may be operable to communicate with the device memory controller 155, with other local memory controllers 165, or directly with the external memory controller 120, or the processor 125, or any combination thereof. Examples of components that may be included in the device memory controller 155 or the local memory controllers 165 or both may include receivers for receiving signals (e.g., from the external memory controller 120), transmitters for transmitting signals (e.g., to the external memory controller 120), decoders for decoding or demodulating received signals, encoders for encoding or modulating signals to be transmitted, or various other components operable for supporting described operations of the device memory controller 155 or local memory controller 165 or both.

The external memory controller 120 may be operable to enable communication of information (e.g., data, commands, or both) between components of the system 100 (e.g., between components of the host device 105, such as the processor 125, and the memory device 110). The external memory controller 120 may process (e.g., convert, translate) communications exchanged between the components of the host device 105 and the memory device 110. In some examples, the external memory controller 120, or other component of the system 100 or the host device 105, or its functions described herein, may be implemented by the processor 125. For example, the external memory controller 120 may be hardware, firmware, or software, or some combination thereof implemented by the processor 125 or other component of the system 100 or the host device 105. Although the external memory controller 120 is depicted as being external to the memory device 110, in some examples, the external memory controller 120, or its functions described herein, may be implemented by one or more components of a memory device 110 (e.g., a device memory controller 155, a local memory controller 165) or vice versa.

The components of the host device 105 may exchange information with the memory device 110 using one or more channels 115. The channels 115 may be operable to support communications between the external memory controller 120 and the memory device 110. Each channel 115 may be an example of a transmission medium that carries information between the host device 105 and the memory device 110. Each channel 115 may include one or more signal paths (e.g., a transmission medium, a conductor) between terminals associated with the components of the system 100. A signal path may be an example of a conductive path operable to carry a signal. For example, a channel 115 may be associated with a first terminal (e.g., including one or more pins, including one or more pads) at the host device 105 and a second terminal at the memory device 110. A terminal may be an example of a conductive input or output point of a device of the system 100, and a terminal may be operable to act as part of a channel.

Channels 115 (and associated signal paths and terminals) may be dedicated to communicating one or more types of information. For example, the channels 115 may include one or more command and address (CA) channels 186, one or more clock signal (CK) channels 188, one or more data (DQ) channels 190, one or more other channels 192, or any combination thereof. In some examples, signaling may be communicated over the channels 115 using single data rate (SDR) signaling or double data rate (DDR) signaling. In SDR signaling, one modulation symbol (e.g., signal level) of a signal may be registered for each clock cycle (e.g., on a rising or falling edge of a clock signal). In DDR signaling, two modulation symbols (e.g., signal levels) of a signal may be registered for each clock cycle (e.g., on both a rising edge and a falling edge of a clock signal).

In some examples, CA channels 186 may be operable to communicate commands between the host device 105 and the memory device 110 including control information associated with the commands (e.g., address information). For example, commands carried by the CA channel 186 may include a read command with an address of the desired data. In some examples, a CA channel 186 may include any quantity of signal paths (e.g., eight or nine signal paths) to communicate control information (e.g., commands or addresses).

In some examples, clock signal channels 188 may be operable to communicate one or more clock signals between the host device 105 and the memory device 110. Clock signals may be operable to oscillate between a high state and a low state, and may support coordination (e.g., in time) between actions of the host device 105 and the memory device 110. In some examples, the clock signal may be single ended. In some examples, the clock signal may provide a timing reference for command and addressing operations for the memory device 110, or other system-wide operations for the memory device 110. A clock signal may be referred to as a control clock signal, a command clock signal, or a system clock signal. A system clock signal may be generated by a system clock, which may include one or more hardware components (e.g., oscillators, crystals, logic gates, transistors).

In some examples, data channels 190 may be operable to communicate information (e.g., data, control information) between the host device 105 and the memory device 110. For example, the data channels 190 may communicate information (e.g., bi-directional) to be written to the memory device 110 or information read from the memory device 110.

The channels 115 may include any quantity of signal paths (including a single signal path). In some examples, a channel 115 may include multiple individual signal paths. For example, a channel may be ×4 (e.g., including four signal paths), ×8 (e.g., including eight signal paths), ×16 (including sixteen signal paths), etc.

In some examples, the one or more other channels 192 may include one or more error detection code (EDC) channels. The EDC channels may be operable to communicate error detection signals, such as checksums, to improve system reliability. An EDC channel may include any quantity of signal paths.

Signals communicated over the channels 115 may be modulated using one or more different modulation schemes. In some examples, a binary-symbol (or binary-level) modulation scheme may be used to modulate signals communicated between the host device 105 and the memory device 110. A binary-symbol modulation scheme may be an example of a M-ary modulation scheme where M is equal to two. A symbol of a binary-symbol modulation scheme may be operable to represent one bit of digital data (e.g., a symbol may represent a logic 1 or a logic 0). Examples of binary-symbol modulation schemes include, but are not limited to, non-return-to-zero (NRZ), unipolar encoding, bipolar encoding, Manchester encoding, pulse amplitude modulation (PAM) having two symbols (e.g., PAM2), and others.

In some examples, a multi-symbol (or multi-level) modulation scheme may be used to modulate signals communicated between the host device 105 and the memory device 110. A multi-symbol modulation scheme may be an example of a M-ary modulation scheme where M is greater than or equal to three. A symbol of a multi-symbol modulation scheme may be operable to represent more than one bit of digital data (e.g., a symbol may represent a logic 00, a logic 01, a logic 10, or a logic 11). Examples of multi-symbol modulation schemes include, but are not limited to, PAM3, PAM4, PAM8, etc., quadrature amplitude modulation (QAM), quadrature phase shift keying (QPSK), and others. A multi-symbol signal (e.g., a PAM3 signal or a PAM4 signal) may be a signal that is modulated using a modulation scheme that includes at least three levels to encode more than one bit of information. Multi-symbol modulation schemes and symbols may alternatively be referred to as non-binary, multi-bit, or higher-order modulation schemes and symbols.

In some examples, an external device may attempt to exploit a memory device 110 by performing a row hammer, in which the external device accesses the same row line (e.g., word line) multiple times within a short interval in order to adjust the contents of memory cells in row lines adjacent to or within a threshold proximity of the accessed row line. In some examples, the memory device 110 may employ a probabilistic scheme to determine whether an external device is performing a row hammer on the memory device 110. However, the probabilistic scheme may fail to identify row hammer in some cases or may incorrectly identify that row hammer has occurred in other cases.

The present disclosure describes a scheme that enables the memory device 110 to determine whether row hammer has occurred deterministically. For instance, a memory array of the memory device 110 may include a set of column lines (e.g., digit lines) that are coupled for each row line with a respective set of memory cells that store a quantity of times that the row line has been accessed, where the memory array extends in a first direction and a second direction and each of the set of column lines extends in the first direction. Additionally, the memory device 110 may include a set of sense amplifiers and a circuit (e.g., a counter) adjacent to the set of sense amplifiers along the second direction that is configured to increment the value of logic states read by the set of sense amplifiers from an accessed row line. If the value is above a threshold amount, the memory device 110 may determine that row hammer is occurring. By determining the row hammer deterministically, the memory device 110 may be less likely to fail to identify that row hammer has occurred and/or may be less likely to incorrectly determine that row hammer has occurred.

Figure 2:
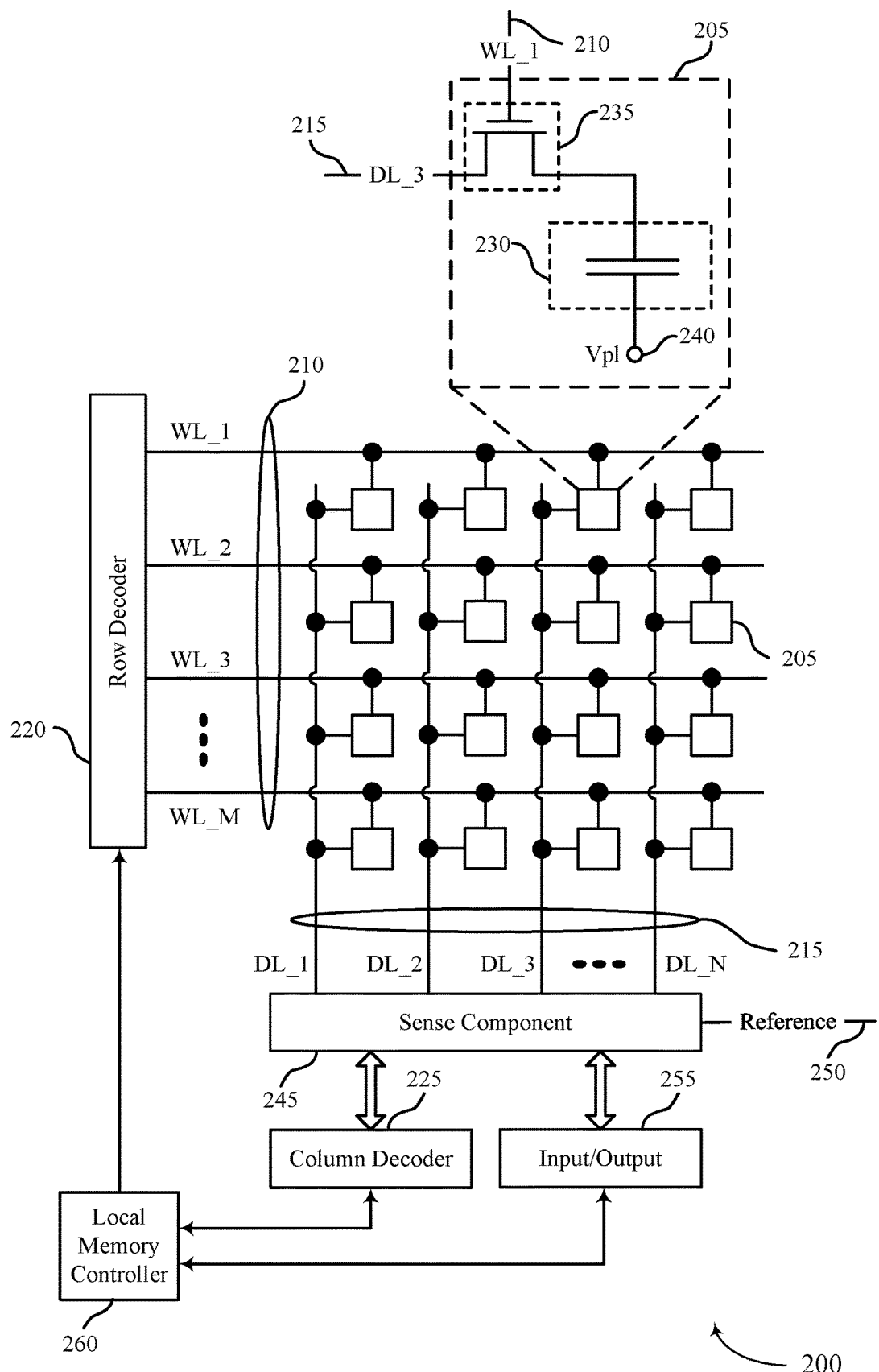
FIG. 2 illustrates an example of a memory die that supports a circuit for tracking access occurrences in accordance with examples as disclosed herein.

FIG. 2 illustrates an example of a memory die 200 that supports a circuit for tracking access occurrences in accordance with examples as disclosed herein. The memory die 200 may be an example of the memory dies 160 described with reference to FIG. 1. In some examples, the memory die 200 may be referred to as a memory chip, a memory device, or an electronic memory apparatus. The memory die 200 may include one or more memory cells 205 that may be programmable to store different logic states (e.g., programmed to one of a set of two or more possible states). For example, a memory cell 205 may be operable to store one bit of information at a time (e.g., a logic 0 or a logic 1). In some examples, a memory cell 205 (e.g., a multi-level memory cell) may be operable to store more than one bit of information at a time (e.g., a logic 00, logic 01, logic 10, a logic 11). In some examples, the memory cells 205 may be arranged in an array, such as a memory array 170 described with reference to FIG. 1.

In some examples, a memory cell 205 may store a charge representative of the programmable states in a capacitor. DRAM architectures may include a capacitor that includes a dielectric material to store a charge representative of the programmable state. In other memory architectures, other storage devices and components are possible. For example, nonlinear dielectric materials may be employed. The memory cell 205 may include a logic storage component, such as capacitor 230, and a switching component 235 (e.g., a cell selection component). The capacitor 230 may be an example of a dielectric capacitor or a ferroelectric capacitor. A node of the capacitor 230 may be coupled with a voltage source 240, which may be the cell plate reference voltage, such as Vpl, or may be ground, such as Vss.

The memory die 200 may include access lines (e.g., word lines 210, digit lines 215) arranged in a pattern, such as a grid-like pattern. An access line may be a conductive line coupled with a memory cell 205 and may be used to perform access operations on the memory cell 205. In some examples, word lines 210 may be referred to as row lines. In some examples, digit lines 215 may be referred to as column lines or bit lines. References to access lines, row lines, column lines, word lines, digit lines, or bit lines, or their analogues, are interchangeable without loss of understanding. Memory cells 205 may be positioned at intersections of the word lines 210 and the digit lines 215.

Operations such as reading and writing may be performed on the memory cells 205 by activating access lines such as a word line 210 or a digit line 215. By biasing a word line 210 and a digit line 215 (e.g., applying a voltage to the word line 210 or the digit line 215), a single memory cell 205 may be accessed at their intersection. The intersection of a word line 210 and a digit line 215 in a two-dimensional or in a three-dimensional configuration may be referred to as an address of a memory cell 205. Activating a word line 210 or a digit line 215 may include applying a voltage to the respective line.

Accessing the memory cells 205 may be controlled through a row decoder 220, or a column decoder 225, or any combination thereof. For example, a row decoder 220 may receive a row address from the local memory controller 260 and activate a word line 210 based on the received row address. A column decoder 225 may receive a column address from the local memory controller 260 and may activate a digit line 215 based on the received column address.

Selecting or deselecting the memory cell 205 may be accomplished by activating or deactivating the switching component 235 using a word line 210. The capacitor 230 may be coupled with the digit line 215 using the switching component 235. For example, the capacitor 230 may be isolated from digit line 215 when the switching component 235 is deactivated, and the capacitor 230 may be coupled with digit line 215 when the switching component 235 is activated.

A word line 210 may be a conductive line in electronic communication with a memory cell 205 that is used to perform access operations on the memory cell 205. In some architectures, the word line 210 may be coupled with a gate of a switching component 235 of a memory cell 205 and may be operable to control the switching component 235 of the memory cell. In some architectures, the word line 210 may be coupled with a node of the capacitor of the memory cell 205 and the memory cell 205 may not include a switching component.

A digit line 215 may be a conductive line that couples the memory cell 205 with a sense component 245. In some architectures, the memory cell 205 may be selectively coupled with the digit line 215 during portions of an access operation. For example, the word line 210 and the switching component 235 of the memory cell 205 may be operable to couple or isolate the capacitor 230 of the memory cell 205 and the digit line 215. In some architectures, the memory cell 205 may be coupled with the digit line 215.

The sense component 245 may be operable to detect a state (e.g., a charge) stored on the capacitor 230 of the memory cell 205 and determine a logic state of the memory cell 205 based on the stored state. The sense component 245 may include one or more sense amplifiers to amplify or otherwise convert a signal resulting from accessing the memory cell 205. The sense component 245 may compare a signal detected from the memory cell 205 to a reference 250 (e.g., a reference voltage). The detected logic state of the memory cell 205 may be provided as an output of the sense component 245 (e.g., to an input/output 255), and may indicate the detected logic state to another component of a memory device (e.g., a memory device 110) that includes the memory die 200.

The local memory controller 260 may control the accessing of memory cells 205 through the various components (e.g., row decoder 220, column decoder 225, sense component 245). The local memory controller 260 may be an example of the local memory controller 165 described with reference to FIG. 1. In some examples, one or more of the row decoder 220, column decoder 225, and sense component 245 may be co-located with the local memory controller 260. The local memory controller 260 may be operable to receive one or more of commands or data from one or more different memory controllers (e.g., an external memory controller 120 associated with a host device 105, another controller associated with the memory die 200), translate the commands or the data (or both) into information that can be used by the memory die 200, perform one or more operations on the memory die 200, and communicate data from the memory die 200 to a host (e.g., a host device 105) based on performing the one or more operations. The local memory controller 260 may generate row signals and column address signals to activate the target word line 210 and the target digit line 215. The local memory controller 260 also may generate and control various signals (e.g., voltages, currents) used during the operation of the memory die 200. In general, the amplitude, the shape, or the duration of an applied voltage or current discussed herein may be varied and may be different for the various operations discussed in operating the memory die 200.

The local memory controller 260 may be operable to perform one or more access operations on one or more memory cells 205 of the memory die 200. Examples of access operations may include a write operation, a read operation, a refresh operation, a precharge operation, or an activate operation, among others. In some examples, access operations may be performed by or otherwise coordinated by the local memory controller 260 in response to various access commands (e.g., from a host device 105). The local memory controller 260 may be operable to perform other access operations not listed here or other operations related to the operating of the memory die 200 that are not directly related to accessing the memory cells 205.

The local memory controller 260 may be operable to perform a write operation (e.g., a programming operation) on one or more memory cells 205 of the memory die 200. During a write operation, a memory cell 205 of the memory die 200 may be programmed to store a desired state (e.g., logic state, charge state). The local memory controller 260 may identify a target memory cell 205 on which to perform the write operation. The local memory controller 260 may identify a target word line 210 and a target digit line 215 coupled with the target memory cell 205 (e.g., an address of the target memory cell 205). The local memory controller 260 may activate the target word line 210 and the target digit line 215 (e.g., applying a voltage to the word line 210 or digit line 215) to access the target memory cell 205. The local memory controller 260 may apply a signal (e.g., a write pulse, a write voltage) to the digit line 215 during the write operation to store a specific state (e.g., charge) in the capacitor 230 of the memory cell 205. The signal used as part of the write operation may include one or more voltage levels over a duration.

The local memory controller 260 may be operable to perform a read operation (e.g., a sense operation) on one or more memory cells 205 of the memory die 200. During a read operation, the state (e.g., logic state, charge state) stored in a memory cell 205 of the memory die 200 may be evaluated (e.g., read, determined, identified). The local memory controller 260 may identify a target memory cell 205 on which to perform the read operation. The local memory controller 260 may identify a target word line 210 and a target digit line 215 coupled with the target memory cell 205 (e.g., the address of the target memory cell 205). The local memory controller 260 may activate the target word line 210 and the target digit line 215 (e.g., applying a voltage to the word line 210 or digit line 215) to access the target memory cell 205. The target memory cell 205 may transfer a signal (e.g., charge, voltage) to the sense component 245 in response to biasing the access lines. The sense component 245 may amplify the signal. The local memory controller 260 may activate the sense component 245 (e.g., latch the sense component) and compare the signal received from the memory cell 205 to a reference (e.g., the reference 250). Based on that comparison, the sense component 245 may determine a logic state that is stored on the memory cell 205.

In some examples, an external device may attempt to exploit a memory device by performing a row hammer, in which the external device accesses the same row line (e.g., word line) multiple times within a short interval in order to adjust the contents of memory cells in row lines adjacent to or within a threshold proximity of the accessed row line. In some examples, the memory device may employ a probabilistic scheme to determine whether an external device is performing a row hammer on the memory device. However, the probabilistic scheme may fail to identify row hammer in some cases or may incorrectly identify that row hammer has occurred in other cases.

Figure 3:
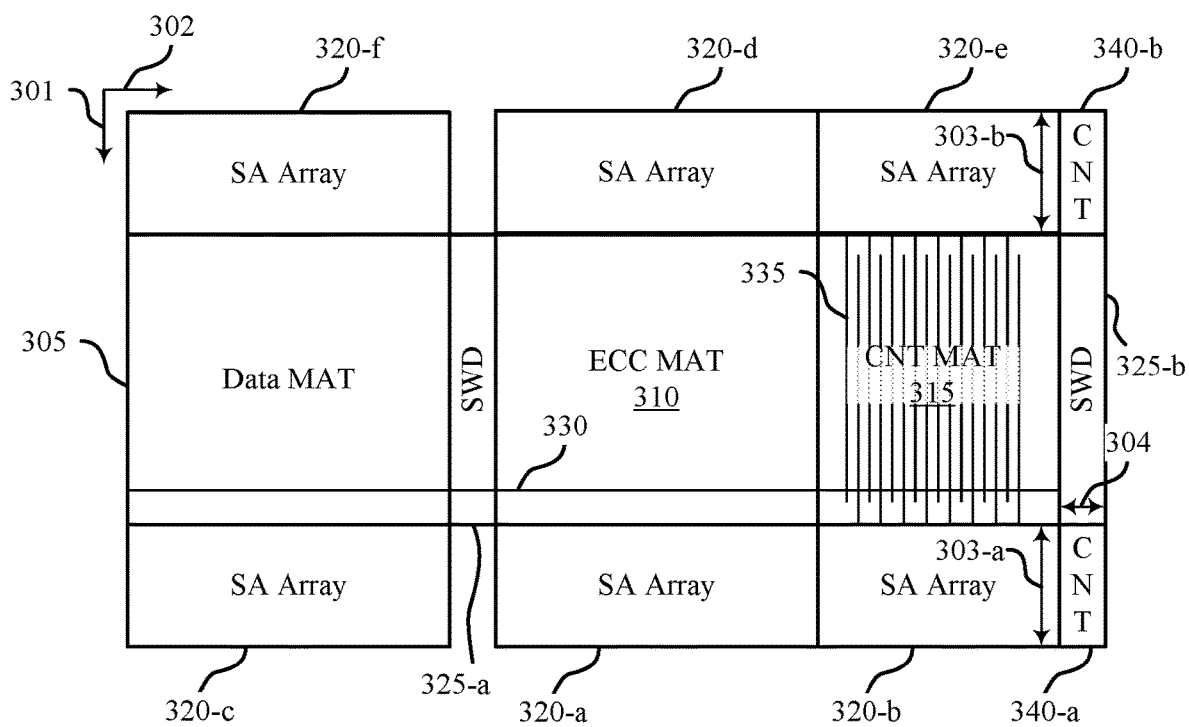
FIG. 3 illustrates an example of a memory array that supports a circuit for tracking access occurrences in accordance with examples as disclosed herein.

The present disclosure describes a scheme that enables the memory device to determine whether row hammer has occurred deterministically. For instance, a memory die 200 of the memory device may include a set of column lines (e.g., digit lines) that are coupled for each row line with a respective set of memory cells that store a quantity of times that the row line has been accessed, where the memory die 200 extends in a first direction and a second direction and each of the set of column lines extends in the first direction. Additionally, the memory device may include a set of sense amplifiers and a circuit (e.g., a counter) adjacent to the set of sense amplifiers along the second direction that is configured to increment the value of logic states read by the set of sense amplifiers from an accessed row line. If the value is above a threshold amount, the memory device may determine that row hammer is occurring. By determining the row hammer deterministically, the memory device may be less likely to fail to identify that row hammer has occurred and/or may be less likely to incorrectly determine that row hammer has occurred FIG. 3 illustrates an example of a memory array 300 that supports a circuit for tracking access occurrences in accordance with examples as disclosed herein. In some examples, memory array 300 may be implemented by one or more aspects of system 100 and/or memory die 200. For instance, memory array 300 may be included in a memory die 200 as described with reference to FIG. 2 and/or a memory device 110 as described with reference to FIG. 1.

In some examples, memory array 300 may include a data memory access tile (MAT) 305, an error correcting code (ECC) MAT 310, and a count (CNT) MAT 315. Each row line 330 (e.g., word line) of the memory array 300 may span each of the MATs. For instance, a row line 330 may be coupled with memory cells of data MAT 305, memory cells of ECC MAT 310, and memory cells of CNT MAT 315. Additionally, each MAT may include a set of row lines spanning the MATs (e.g., row line 330) and a respective set of column lines (e.g., digit lines), where a first subset (e.g., half) of the set of column lines may be coupled with a first sense amplifier array and a second subset (e.g., half) of the set of column lines may be coupled with a second sense amplifier array. For instance, a first subset of the set of column lines for data MAT 305 may be coupled with sense amplifier array 320-*c* and a second subset of the set of column lines for data MAT 305 may be coupled with sense amplifier array 320-*f* (e.g., in an alternating pattern). Additionally, a first subset of the set of column lines for ECC MAT 310 may be coupled with sense amplifier array 320-*a* and a second subset of the set of column lines for ECC MAT 310 may be coupled with a second sense amplifier array 320-*d*. Additionally, a first subset of the set of column lines for CNT MAT 315 may be coupled with sense amplifier array 320-*b* and a second subset of the set of column lines for CNT MAT 315 may be coupled with sense amplifier array 320-*e*. Sense amplifier array 320-*e* may be coupled with circuit 340-*b* (e.g., an 8-bit counter) and sense amplifier array 320-*b* may be coupled with circuit 340-*a* (e.g., an 8-bit counter). Additionally, each row line 330 within ECC MAT 310 and CNT MAT 315 may be coupled with sub-word-line-driver (SWD) 325-*a* and SWD 325-*b*.

In some examples, the columns lines 335 may extend in a first direction 301 and each row line 330 may extend in a second direction 302. In some such examples, the circuit 340-*a* may be adjacent to sense amplifier array 320-*b* along the second direction 302 and may be adjacent to the SWD 325-*b* along the first direction 301. Similarly, the circuit 340-*b* may be adjacent to sense amplifier array 320-*e* along the first direction 301 and may be adjacent to the SWD 325-*b* along the second direction 302. In some examples, the circuit 340-*a* may be located within an area with dimensions equal to a height 303-*a* of sense amplifier array 320-*b* multiplied by a width 304 of SWD 325-*b*. Similarly, the circuit 340-*b* may be located within an area with dimensions equal to a height 303-*b* of sense amplifier array 320-*e* multiplied by the width 304 of SWD 325-*b*. Additionally, the circuit 340-*a* may be positioned within a first edge bound by height 303-*a* and within a second edge bound by width 304. Similarly, the circuit 340-*b* may be positioned within a first edge bound by height 303-*b* and within a second edge bound by width 304.

In some examples, for a given row line 330, the memory cells of data MAT 305 coupled with the row line 330 may store data, the memory cells of the ECC MAT 305 and coupled with the row line 330 may store ECC information for the data stored in the data MAT 305 for the row line 330, and the memory cells of the CNT MAT 315 may be configured to store a quantity of times that the row line 330 has been accessed. Each sense amplifier array (e.g., sense amplifier arrays 320-*a*, 320-*b*, 320-*c*, 320-*d*, 320-*e*, and 320-*f*) may be configured to sense logic values stored at column lines of the MAT to which the sense amplifier array is coupled. Each circuit 340-*a* and 340-*b* may be configured to increment the quantity of times (e.g., stored in CNT MAT 315) that a row line 330 has been accessed for memory cells (e.g., data MAT 305, ECC MAT 310) coupled with the row line 330. Each SWD 325-*a* and 325-*b* may be configured to select a sub-word line.

In some examples, circuits 340-*a* and 340-*b* may each be 8-bit counters and may be operable to increment a 16-bit value. For instance, circuit 340-*a* may adjust values for the second subset of the set of column lines 335 for CNT MAT 315 and may output a carry value to circuit 340-*b* based on adjusting the values for the second subset of the set of column lines 335. Using the carry value, circuit 340-*b* may adjust the values for the first subset of the set of column lines 335 such that the value stored at the first subset and the second subset of the set of column lines 335 is incremented.

In some examples, each sense amplifier coupled with a column line of data MAT 305 and ECC MAT 310 may be coupled with a column select line that extends into the sense amplifier array. In some examples, a memory device may open a page for a row line 330 within the data MAT 305 and may use the column select line in order to read a subset of the memory cells (e.g., by selecting a subset of the total columns in the data MAT 305) coupled with the row line 330. By using the column select lines, a memory device may perform multiple reads or writes on separate subsets of memory cells of the data MAT 305 and/or the ECC MAT 310 without re-opening the page. However, in the CNT MAT 315, each memory cell coupled with the row line 330 may be accessed each time the row line 330 is activated. Accordingly, column select lines may not be employed for the sense amplifiers coupled with column lines of the CNT MAT 315. Instead, SA arrays 320-e and 320-b may include lines that route their respective sense amplifiers with circuits 340-b or 340-a, respectively (e.g., instead of column select lines).

In some examples, the value incremented by circuits 340-a and 340-b may exceed a threshold value. When the value exceeds the threshold value, circuit 340-a or 340-b may output a flag indicating that the count has exceeded the threshold value. Based on the flag, a memory device including memory array 300 may determine that a row hammer is being performed on the memory array 300 and the memory device may refresh the row as well other rows within a proximity of the row (e.g., neighboring rows).

Figure 4:
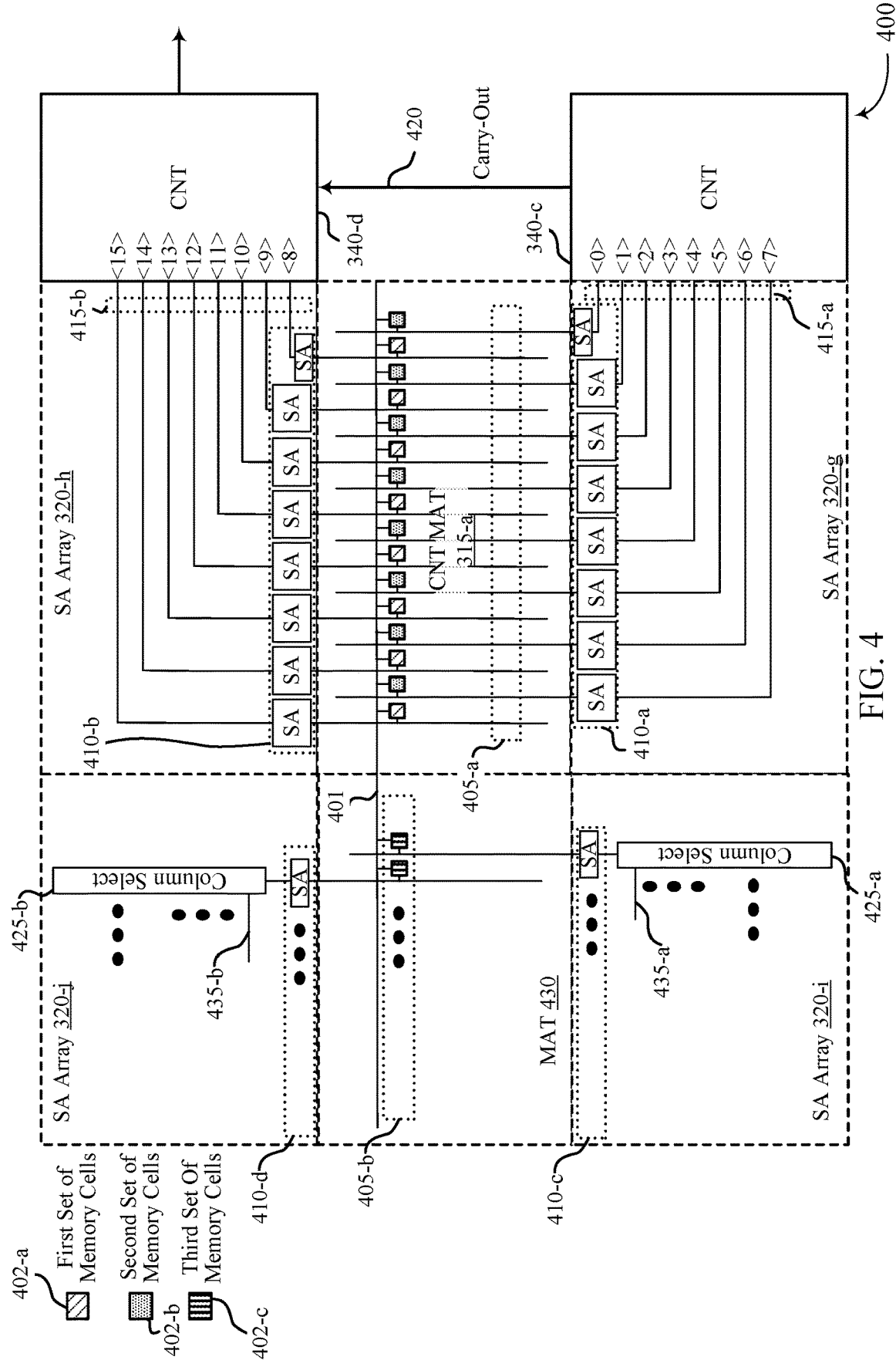
FIG. 4 illustrates an example of a counting schemes that supports a circuit for tracking access occurrences in accordance with examples as disclosed herein.

FIG. 4 illustrates an example of a counting scheme 400 that supports a circuit for tracking access occurrences in accordance with examples as disclosed herein. In some examples, counting scheme 400 may implement one or more aspects of memory array 300. For instance, CNT MAT 315-a may be an example of a CNT MAT 315 as described with reference to FIG. 3; sense amplifier arrays 320-g, 320-h, 320-i, and 320-j may be examples of sense amplifier arrays 320-a through 320-f as described with reference to FIG. 3; circuits 340-c and 340-d may be examples of circuits 340-a and 340-b as described with reference to FIG. 3. Additionally, column lines 405 may be examples of column lines 335 as described with reference to FIG. 3 and MAT 430 may be an example of an ECC MAT 310 or a data MAT 305 as described with reference to FIG. 3.

Column lines 405-a of CNT MAT 315-a may be coupled with a first set of sense amplifiers 410-a of sense amplifier array 320-g and a second set of sense amplifiers 410-b of sense amplifier array 320-h. Additionally, the first set of sense amplifiers 410-a may be coupled with circuit 340-c via routing lines 415-a and the second set of sense amplifiers may be coupled with circuit 340-d via routing lines 415-b. Additionally, the column lines 405-b of MAT 430 may be coupled with a third set of sense amplifiers 410-c of sense amplifier array 320-i and a fourth set of sense amplifiers 410-d of sense amplifier array 320-j. Additionally, the third set of sense amplifiers 410-c may be coupled with a column select component 425-a and the fourth set of sense amplifiers 410-d may be coupled with a column select component 425-b. In some examples, routing lines 415-a and 415-b may be routed through sense amplifier arrays 320-h and 320-g in examples in which column lines 405-a are not coupled with column select lines (e.g., column select lines 435-a and 435-b), as routing lines 415-a and 415-b may be substituted for the column select lines and associated circuitry in CNT 315-a.

In some examples, a first portion (e.g., half) of column lines 405-a may be coupled with the first set of sense amplifiers 410-a and a second portion (e.g., half) of column lines 405-b may be coupled with the second set of sense amplifiers 410-b (e.g., in an alternating fashion). For instance, the first portion of columns lines 405-a may include 8 column lines (e.g., column lines storing values <0> through <7> with associated routing lines input into circuit 340-c) and the second portion of column lines 405-a may include 8 other column lines (e.g., column line storing values <8> through <15> input into circuit 340-d). In some examples, the first portion of column lines 405-a may be coupled with a first set of memory cells 402-a associated with a row line 401 and the second portion of column lines 405-a may be coupled with a second set of memory cells 402-b associated with the row line 401. Additionally, column lines 405-b may be coupled with memory cells 402-c. If MAT 430 is an ECC MAT, a data MAT adjacent to MAT 430 may also include memory cells coupled with respective column lines and row line 401.

In the present example, circuits 340-c and 340-d may each be 8-bit counters and may be operable to increment a 16-bit value. For instance, circuit 340-c may adjust values <0:7> stored at memory cells of the first portion of column lines and may output a carry value to circuit 340-b based on adjusting the values <0:7> for the memory cells of the first portion of column lines. Using the carry value, circuit 340-d may adjust values <8:15> for memory cells of the second portion of column lines such that the value stored at the first portion and the second portion of column lines 405-a is incremented.

Figure 5A:
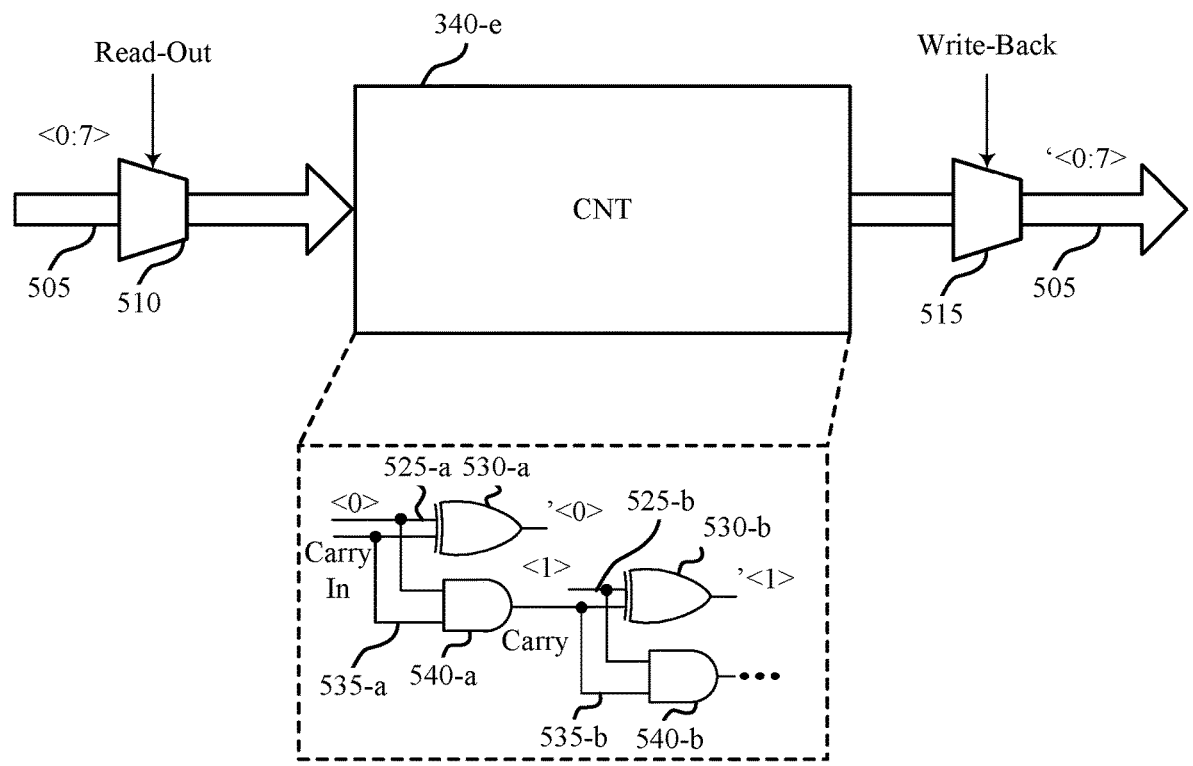
FIGS. 5A and 5B illustrate examples of counter schematics that support a circuit for tracking access occurrences in accordance with examples as disclosed herein.
Figure 5B:
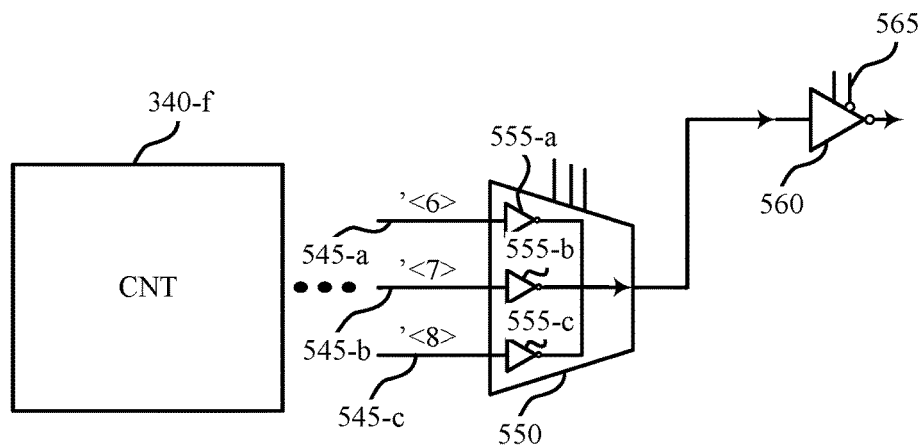

FIGS. 5A and 5B illustrate examples of counter schematics 500-a and 500-b that support a circuit for tracking access occurrences in accordance with examples as disclosed herein. In some examples, counter schematics 500-a and 500-b may implement one or more aspects of memory array 300 and counting scheme 400. For instance, circuits 340-e and 340-f may be examples of circuits 340-a through 340-d as described with reference to FIGS. 3 and/or 4.

A memory device may perform a read out from a first set of column lines of a MAT (e.g., a CNT MAT as described herein, such as CNT MAT 315-a) and pass-gate 510 may selectively couple a set of local input output (LIO) lines carrying logic state values <0:7> with a circuit 340-e (e.g., an 8-bit counter). Circuit 340-e may increment the logic state values <0:7> to generate incremented logic state values '<0:7> and may write back the incremented logic state values '<0:7> to the first set of column lines. In some examples, a first logic state value <0> of the sensed logic state values <0:7> and associated with a first column line of the first set of column lines may be input along conductive line 525-a (e.g., a routing line) into exclusive-or (XOR) gate 530-a along with a carry in value along conductive line 535-a in order to generate an updated value '<0> that is written back to the first column. Additionally, conductive line 525-a and 535-a may be input into AND gate 530-a to generate a carry along conductive line 535-b. A second logic state value <1> of the sensed logic state values <0:7> and associated with a second column line of the first set of column lines may be input along conductive line 525-b (e.g., a routing lie) into XOR gate 530-a along with the carry value generated from AND gate 540-a in order to generate an updated value '<1> that is written back to the second column. Additionally, conductive line 525-b and 535-b may be input into AND gate 530-a to generate a carry along another conductive line. This process may continue until an updated logic value '<7> has been generated, at which point the carry may be input as the carry-in for another circuit (e.g., another counter) and the process may repeat for logic state values <8:15> as described herein. After generating updated logic state values '<0> through '<7> (e.g., '<0:7>), tri-state driver 515 may be activated, which may enable writeback of logic state values '<0:7> along the respective LIO lines 505 (e.g., '<0> may be input to the LIO line 505 that output <0>, '<1> may be input to the LIO line 505 that output '<1>, and so on). During the writeback of the incremented logic state values, pass gate 510 may be disabled such that the incremented logic state values do not flow through circuit 340-e. After performing the writeback, tri-state driver 515 may be deactivated.

In some examples, one or more circuits (e.g., one or more counters), such as circuit 340-f (e.g., a counter) may output one or more of the updated logic values to determine if a row access threshold has been reached. For instance, the updated logic state value for <6> (e.g., '<6>), the updated logic state value for <7> (e.g., '<7>'), and the updated logic state value for <8> (e.g., '<8>') may be output to a selector 550. In some examples, <6>, <7>, and <8> may correspond to most significant bits (MSBs). Selector 550 may include NOT gates 555-*a*, 555-*b*, and 555-*c* that may invert '<6>', '<7>', and '<8>', respectively. The selector 550 may select one of the inverted values of '<6>', '<7>', and '<8>' in order to generate a carry-out flag. In some examples, selector 550 may be programmable to support different row access thresholds. For instance, in the case of a 16-bit counter, if selector 550 selects line 545-*a* (e.g., the line carry '<6>', the row access threshold may be equal to $2^{13}$, if selector 550 selects line 545-*b* (e.g., the line carrying logic state value '<7>'), the row access threshold may be equal to $2^{14}$, and if selector 550 selects line 545-*c* (e.g., the line carrying logic state value '<8>'), the row access threshold may be equal to $2^{15}$.

The carry-out flag may be input into inverting tri-state driver 560, which may generate a global flag to alert the memory device that the threshold has been reached In some examples, an input 565 to inverting tri-state driver 560 may be operable to enable inverting tri-state driver 560 to output a flag (e.g., a logic value carried by input 565 may activate or deactivate inverting tri-state driver 560). In some examples, each memory array, memory array section, or memory bank of a memory device may include a respective selector 550 and a respective inverting tri-state driver 560. For instance, a memory device includes three memory arrays (e.g., each with a respective data MAT, ECC MAT, and CNT MAT), the memory device may include three selectors 550 and three tri-state drivers 560 (e.g., one for each memory array). In some examples, tri-state drivers for memory arrays, memory array sections, or memory banks that are not being read may be disabled (e.g. via input 565).

Figure 6:
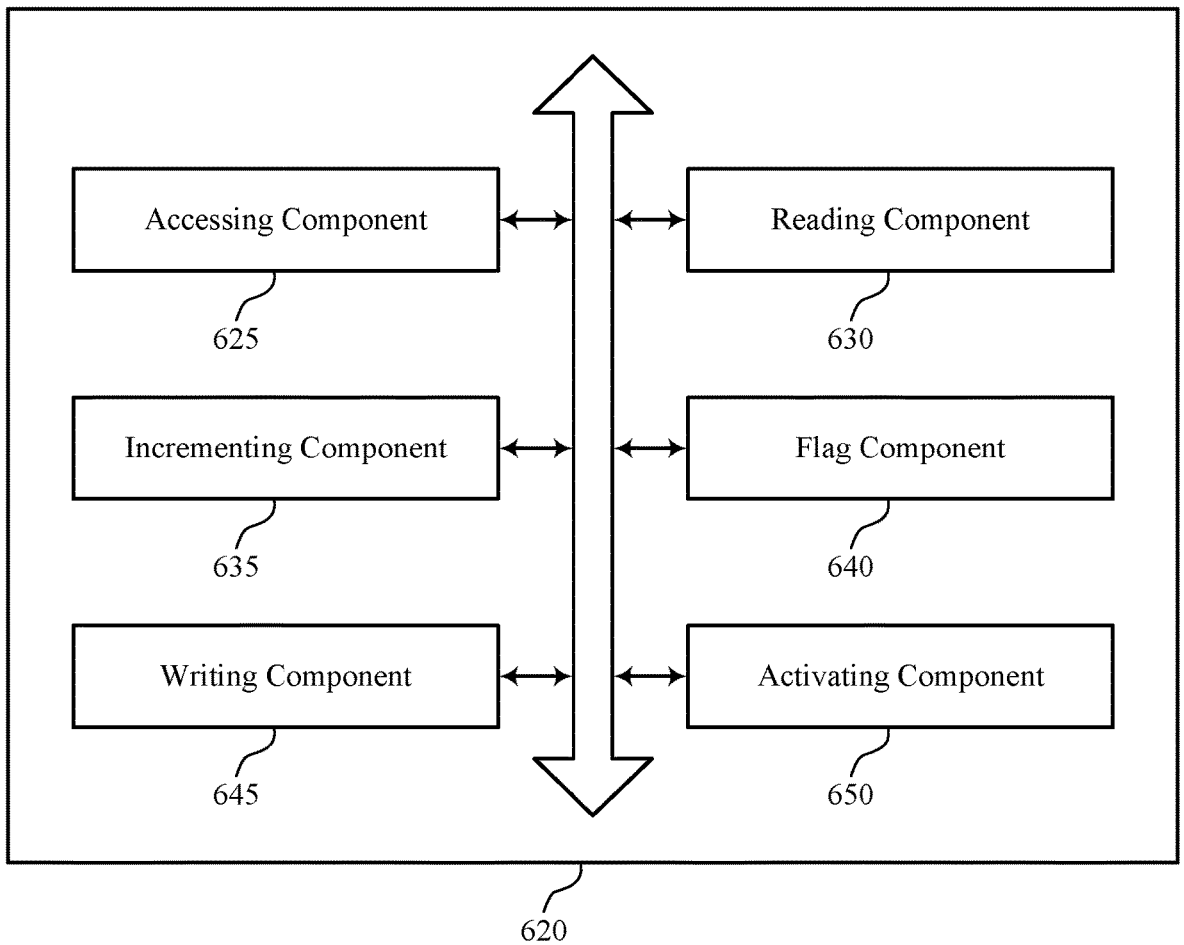
FIG. 6 shows a block diagram of a memory device that supports a circuit for tracking access occurrences in accordance with examples as disclosed herein.

FIG. 6 shows a block diagram 600 of a memory device 620 that supports a circuit for tracking access occurrences in accordance with examples as disclosed herein. The memory device 620 may be an example of aspects of a memory device as described with reference to FIGS. 1 through 5. The memory device 620, or various components thereof, may be an example of means for performing various aspects of circuit for tracking access occurrences as described herein. For example, the memory device 620 may include an accessing component 625, a reading component 630, an incrementing component 635, a flag component 640, a writing component 645, an activating component 650, or any combination thereof. Each of these components may communicate, directly or indirectly, with one another (e.g., via one or more buses).

The accessing component 625 may be configured as or otherwise support a means for accessing, as part of an access operation for a row line of a set of row lines of a memory array, memory cells of the memory array coupled with the row line, where the memory array includes a first set of column lines and a second set of column lines both extending in a first direction, and where each row line of the set of row lines extends in a second direction orthogonal to the first direction and is coupled with a first set of memory cells that are coupled with the first set of column lines and a second set of memory cells that are coupled with the second set of column lines. The reading component 630 may be configured as or otherwise support a means for reading, by a set of sense amplifiers based at least in part on accessing the row line, the memory cells, where sense amplifiers of a first subset of the set of sense amplifiers are coupled with corresponding column lines of the first set of column lines and sense amplifiers of a second subset of the set of sense amplifiers are coupled with corresponding column lines of the second set of column lines. The incrementing component 635 may be configured as or otherwise support a means for incrementing, by a circuit adjacent to the set of sense amplifiers along the second direction and based at least in part on the access operation for the row line, a value including logic states read by the second subset of the set of sense amplifiers.

In some examples, the set of sense amplifiers extend over a first dimension in the first direction. In some examples, the second set of column lines and the circuit are coupled with each other via a set of conductive lines located within the first dimension of the first direction.

In some examples, the writing component 645 may be configured as or otherwise support a means for writing, via the second subset of the set of sense amplifiers, adjusted logic states at the memory cells associated with the row line of the set of row lines based at least in part on incrementing the value including the logic states, where the adjusted logic states are associated with the incremented value.

In some examples, the activating component 650 may be configured as or otherwise support a means for activating the row line, where incrementing the value is based at least in part on activating the row line.

In some examples, the memory array includes a third set of column lines extending in the first direction. In some examples, the row line is coupled with a third set of memory cells coupled with the third set of column lines and configured to store error correcting code information.

In some examples, the flag component 640 may be configured as or otherwise support a means for outputting, from the circuit, a flag indicating that the incremented value is above a threshold quantity.

In some examples, the memory array includes a dynamic random access memory (DRAM) memory array.

In some examples, each row line of the set of row lines includes a word line and. In some examples, each column line of the first set of column lines and the second set of column lines includes a digit line.

Figure 7:
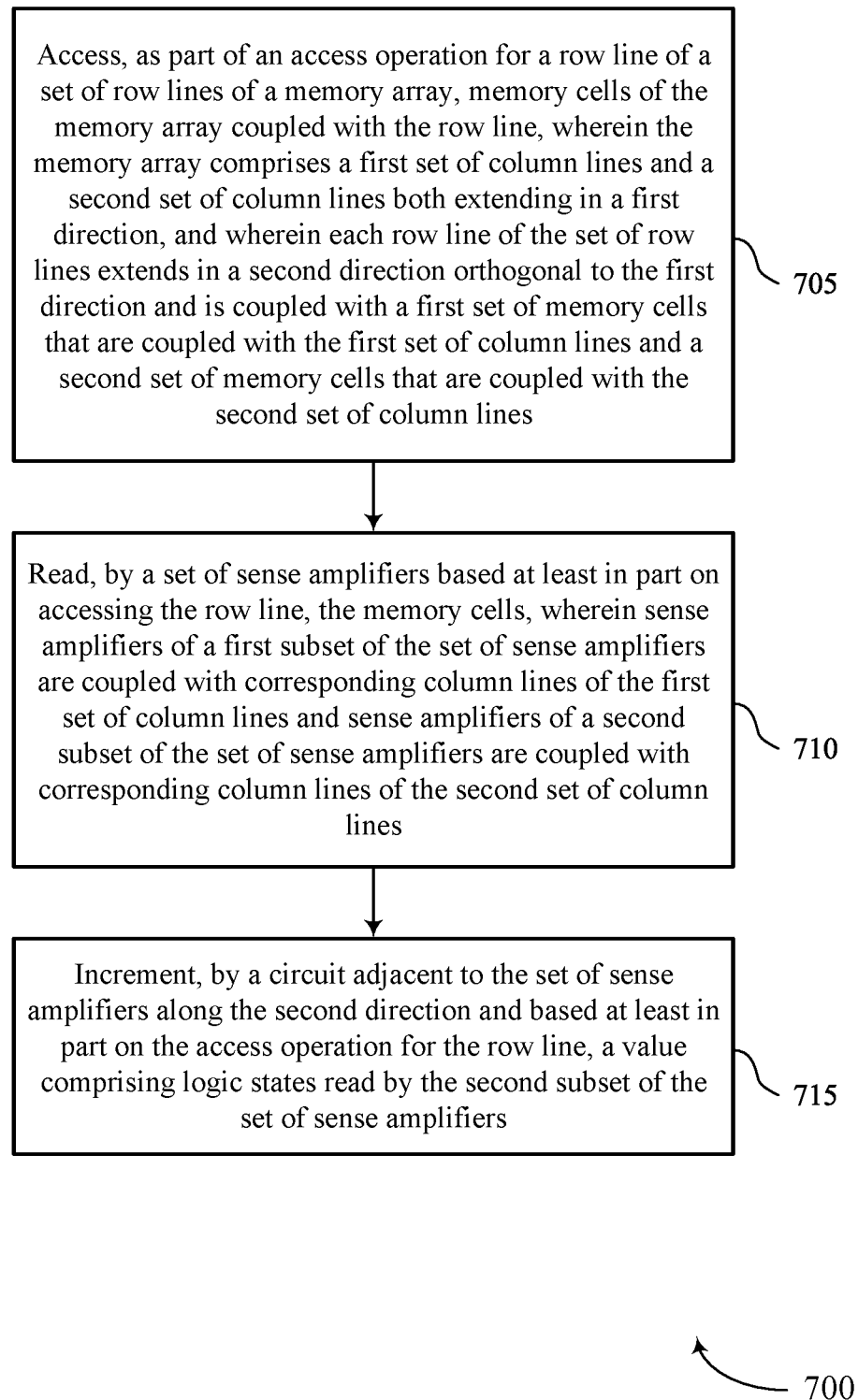

FIG. 7 shows a flowchart illustrating a method 700 that supports a circuit for tracking access occurrences in accordance with examples as disclosed herein. The operations of method 700 may be implemented by a memory device or its components as described herein. For example, the operations of method 700 may be performed by a memory device as described with reference to FIGS. 1 through 6. In some examples, a memory device may execute a set of instructions to control the functional elements of the device to perform the described functions. Additionally, or alternatively, the memory device may perform aspects of the described functions using special-purpose hardware.

At 705, the method may include accessing, as part of an access operation for a row line of a set of row lines of a memory array, memory cells of the memory array coupled with the row line, wherein the memory array comprises a first set of column lines and a second set of column lines both extending in a first direction, and wherein each row line of the set of row lines extends in a second direction orthogonal to the first direction and is coupled with a first set of memory cells that are coupled with the first set of column lines and a second set of memory cells that are coupled with the second set of column lines. The operations of 705 may be performed in accordance with examples as disclosed herein. In some examples, aspects of the operations of 705 may be performed by an accessing component 625 as described with reference to FIG. 6.

At 710, the method may include reading, by a set of sense amplifiers based at least in part on accessing the row line, the memory cells, wherein sense amplifiers of a first subset of the set of sense amplifiers are coupled with corresponding column lines of the first set of column lines and sense amplifiers of a second subset of the set of sense amplifiers are coupled with corresponding column lines of the second set of column lines. The operations of 710 may be performed in accordance with examples as disclosed herein. In some examples, aspects of the operations of 710 may be performed by a reading component 630 as described with reference to FIG. 6.

At 715, the method may include incrementing, by a circuit adjacent to the set of sense amplifiers along the second direction and based at least in part on the access operation for the row line, a value comprising logic states read by the second subset of the set of sense amplifiers. The operations of 715 may be performed in accordance with examples as disclosed herein. In some examples, aspects of the operations of 715 may be performed by an incrementing component 635 as described with reference to FIG. 6.

It should be noted that the methods described herein describe possible implementations, and that the operations and the steps may be rearranged or otherwise modified and that other implementations are possible. Further, portions from two or more of the methods may be combined.

An apparatus is described. The following provides an overview of aspects of the apparatus as described herein:

Aspect 1: An apparatus, including: a memory array including a first set of column lines and a second set of column lines both extending in a first direction and a set of row lines extending in a second direction orthogonal to the first direction, each row line of the set of row lines coupled with a first set of memory cells that are coupled with the first set of column lines and with a second set of memory cells that are coupled with the second set of column lines; a set of sense amplifiers adjacent to the memory array in the first direction, a first subset of the set of sense amplifiers coupled with corresponding column lines of the first set of column lines and a second subset of the set of sense amplifiers coupled with corresponding column lines of the second set of column lines, where the set of sense amplifiers are configured to read logic states stored in memory cells associated with a row line of the set of row lines based at least in part on an access operation for the row line; and a circuit adjacent to the set of sense amplifiers along the second direction, where the circuit is configured to increment, based at least in part on the access operation for the row line, a value including the logic states read by the second subset of the set of sense amplifiers.

Aspect 2: The apparatus of aspect 1, where the set of sense amplifiers extend over a first dimension in the first direction, and the second set of column lines and the circuit are coupled with each other via a set of conductive lines located within the first dimension of the first direction.

Aspect 3: The apparatus of aspect 2, where the second subset of the set of sense amplifiers are configured to write adjusted logic states to the memory cells associated with the row line of the set of row lines based at least in part on the circuit incrementing the value including the logic states, the adjusted logic states are associated with the incremented value.

Aspect 4: The apparatus of aspect 3, where the circuit is configured to increment the value based at least in part on the row line being activated.

Aspect 5: The apparatus of any of aspects 1 through 4, where the set of sense amplifiers include a first set of sense amplifiers that are adjacent to a first side of the memory array in the first direction, and the circuit includes a first circuit, the apparatus further including: a second set of sense amplifiers adjacent to a second side of the memory array in the first direction, where sense amplifiers of a first subset of the second set of sense amplifiers are coupled with corresponding column lines of the first set of column lines, and where the second subset of the first set of sense amplifiers are coupled with a first subset of the second set of column lines and a second subset of the second set of sense amplifiers are coupled with a second subset of the second set of column lines; and a second circuit adjacent to the second set of sense amplifiers along the second direction, where the second circuit is configured to increment, based at least in part on the access operation for the row line, a value including the logic states read by the second subset of the set of sense amplifiers.

Aspect 6: The apparatus of aspect 5, further including: a carry signal coupled with the first circuit and the second circuit and configured to indicate a carry out for the first circuit to the second circuit.

Aspect 7: The apparatus of any of aspects 1 through 6, where the memory array includes a third set of column lines extending in the first direction, and the row line is coupled with a third set of memory cells coupled with the third set of column lines and configured to store error correcting code information.

Aspect 8: The apparatus of any of aspects 1 through 7, where the circuit is configured to output a flag indicating that the incremented value is above a threshold quantity.

Aspect 9: The apparatus of any of aspects 1 through 8, where the memory array includes a dynamic random access memory (DRAM) memory array.

Aspect 10: The apparatus of any of aspects 1 through 9, where each row line of the set of row lines includes a word line and each column line of the first set of column lines and the second set of column lines includes a digit line.

Aspect 11: The apparatus of any of aspects 1 through 10, where a quantity of column lines of the second set of column lines is fewer than a quantity of column lines of the first set of column lines.

An apparatus is described. The following provides an overview of aspects of the apparatus as described herein:

Aspect 12: An apparatus, including: a memory array including a first set of column lines and a second set of column lines both extending in a first direction and a set of row lines extending in a second direction orthogonal to the first direction, where each row line of the set of row lines is coupled with a first set of memory cells that are coupled with the first set of column lines and a second set of memory cells that are coupled with the second set of column lines; a set of sense amplifiers extending over a first dimension in the first direction, where sense amplifiers of a first subset of the set of sense amplifiers are coupled with corresponding column lines of the first set of column lines and sense amplifiers of a second subset of the set of sense amplifiers are coupled with corresponding column lines of the second set of column lines, where the set of sense amplifiers are configured to read logic states stored in memory cells associated with a row line of the set of row lines based at least in part on an access operation for the row line; and a circuit coupled with the second subset of the set of sense amplifiers via a set of conductive lines located within the first dimension of the first direction, the circuit configured to increment, based at least in part on the access operation for the row line, a value including the logic states read by the second subset of the set of sense amplifiers.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (e.g., in conductive contact with, connected with, coupled with) one another if there is any electrical path (e.g., conductive path) between the components that can, at any time, support the flow of signals (e.g., charge, current voltage) between the components. At any given time, a conductive path between components that are in electronic communication with each other (e.g., in conductive contact with, connected with, coupled with) may be an open circuit or a closed circuit based on the operation of the device that includes the connected components. A conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to condition of moving from an open-circuit relationship between components in which signals are not presently capable of being communicated between the components (e.g., over a conductive path) to a closed-circuit relationship between components in which signals are capable of being communicated between components (e.g., over the conductive path). When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components, the controller affects a change that prevents signals from flowing between the components using a conductive path that previously permitted signals to flow.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component (e.g., a transistor) discussed herein may represent a field-effect transistor (FET), and may comprise a three-terminal component including a source (e.g., a source terminal), a drain (e.g., a drain terminal), and a gate (e.g., a gate terminal). The terminals may be connected to other electronic components through conductive materials (e.g., metals, alloys). The source and drain may be conductive, and may comprise a doped (e.g., heavily-doped, degenerate) semiconductor region. The source and drain may be separated by a doped (e.g., lightly-doped) semiconductor region or channel. If the channel is n-type (e.g., majority carriers are electrons), then the FET may be referred to as a n-type FET. If the channel is p-type (e.g., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

The functions described herein may be implemented in hardware, software executed by a processor, firmware, or any combination thereof. If implemented in software executed by a processor, the functions may be stored on or transmitted over as one or more instructions (e.g., code) on a computer-readable medium. Other examples and implementations are within the scope of the disclosure and appended claims. For example, due to the nature of software, functions described herein can be implemented using software executed by a processor, hardware, firmware, hardwiring, or combinations of any of these. Features implementing functions may also be physically located at various positions, including being distributed such that portions of functions are implemented at different physical locations.

For example, the various illustrative blocks and modules described in connection with the disclosure herein may be implemented or performed with a processor, such as a DSP, an ASIC, an FPGA, discrete gate logic, discrete transistor logic, discrete hardware components, other programmable logic device, or any combination thereof designed to perform the functions described herein. A processor may be an example of a microprocessor, a controller, a microcontroller, a state machine, or any type of processor. A processor may also be implemented as a combination of computing devices (e.g., a combination of a DSP and a microprocessor, multiple microprocessors, one or more microprocessors in conjunction with a DSP core, or any other such configuration).

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a computer, or a processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A memory device, comprising:
    a memory array comprising a first set of column lines and a second set of column lines both extending in a first direction and a set of row lines extending in a second direction orthogonal to the first direction, each row line of the set of row lines coupled with a first set of memory cells that are coupled with the first set of column lines and with a second set of memory cells that are coupled with the second set of column lines;
    a set of sense amplifiers adjacent to the memory array in the first direction and extending over a first dimension in the first direction, a first subset of the set of sense amplifiers coupled with corresponding column lines of the first set of column lines and a second subset of the set of sense amplifiers coupled with corresponding column lines of the second set of column lines, wherein the set of sense amplifiers are configured to read logic states stored in memory cells associated with a row line of the set of row lines based at least in part on an access operation for the row line; and
    a counter adjacent to the set of sense amplifiers along the second direction and located within the first dimension in the first direction, wherein the counter is configured to track a quantity of access operations for the row line by incrementing a value based at least in part on the access operation for the row line, wherein, prior to incrementing the value, the value comprises the logic states read by the second subset of the set of sense amplifiers.

2. The memory device of claim 1, wherein
the second set of column lines and the counter are coupled with each other via a set of conductive lines located within the first dimension of the first direction.

3. The memory device of claim 1, wherein:
the second subset of the set of sense amplifiers are configured to write adjusted logic states to the memory cells associated with the row line of the set of row lines based at least in part on the counter incrementing the value comprising the logic states, and the adjusted logic states are associated with the incremented value.

4. The memory device of claim 3, wherein the counter is configured to increment the value based at least in part on the row line being activated.

5. The memory device of claim 1, wherein the set of sense amplifiers comprise a first set of sense amplifiers that are adjacent to a first side of the memory array in the first direction, and the counter comprises a first counter, the memory device further comprising:
    a second set of sense amplifiers adjacent to a second side of the memory array in the first direction, wherein sense amplifiers of a first subset of the second set of sense amplifiers are coupled with corresponding column lines of the first set of column lines, and
    wherein the second subset of the first set of sense amplifiers are coupled with a first subset of the second set of column lines and a second subset of the second set of sense amplifiers are coupled with a second subset of the second set of column lines; and
    a second counter adjacent to the second set of sense amplifiers along the second direction, wherein the second counter is configured to increment, based at least in part on the access operation for the row line, a value comprising the logic states read by the second subset of the set of sense amplifiers.

6. The memory device of claim 5, further comprising:
    a carry signal coupled with the first counter and the second counter and configured to indicate a carry out for the first counter to the second counter.

7. The memory device of claim 1, wherein:
the memory array comprises a third set of column lines extending in the first direction, and
the row line is coupled with a third set of memory cells coupled with the third set of column lines and configured to store error correcting code information.

8. The memory device of claim 1, wherein the counter is configured to output a flag indicating that the incremented value is above a threshold quantity.

9. The memory device of claim 1, wherein the memory array comprises a dynamic random access memory (DRAM) memory array.

10. The memory device of claim 1, wherein:
each row line of the set of row lines comprises a word line and each column line of the first set of column lines and the second set of column lines comprises a digit line.

11. The memory device of claim 1, wherein a quantity of column lines of the second set of column lines is fewer than a quantity of column lines of the first set of column lines.

12. A method by a memory device, comprising:
accessing, as part of an access operation for a row line of a set of row lines of a memory array, memory cells of the memory array coupled with the row line, wherein the memory array comprises a first set of column lines and a second set of column lines both extending in a first direction, and wherein each row line of the set of row lines extends in a second direction orthogonal to the first direction and is coupled with a first set of memory cells that are coupled with the first set of column lines and a second set of memory cells that are coupled with the second set of column lines;
reading, by a set of sense amplifiers based at least in part on accessing the row line, the memory cells, wherein sense amplifiers of a first subset of the set of sense amplifiers are coupled with corresponding column lines of the first set of column lines and sense amplifiers of a second subset of the set of sense amplifiers are coupled with corresponding column lines of the second set of column lines, wherein the set of sense amplifiers are adjacent to the memory array in the first direction and extend over a first dimension in the first direction; and
tracking, by a counter adjacent to the set of sense amplifiers along the second direction and located within the first dimension in the first direction, a quantity of access operations for the row line by incrementing a value based at least in part on the access operation for the row line, wherein, prior to incrementing the value, the value comprises logic states read by the second subset of the set of sense amplifiers.

13. The method of claim 12, wherein
the second set of column lines and the counter are coupled with each other via a set of conductive lines located within the first dimension of the first direction.

14. The method of claim 13, further comprising:
writing, via the second subset of the set of sense amplifiers, adjusted logic states at the memory cells associated with the row line of the set of row lines based at least in part on incrementing the value comprising the logic states, wherein the adjusted logic states are associated with the incremented value.

15. The method of claim 14, further comprising:
activating the row line, wherein incrementing the value is based at least in part on activating the row line.

16. The method of claim 12, wherein:
the memory array comprises a third set of column lines extending in the first direction, and
the row line is coupled with a third set of memory cells coupled with the third set of column lines and configured to store error correcting code information.

17. The method of claim 12, further comprising:
outputting, from the counter, a flag indicating that the incremented value is above a threshold quantity.

18. The method of claim 12, wherein the memory array comprises a dynamic random access memory (DRAM) memory array.

19. The method of claim 12, wherein:
each row line of the set of row lines comprises a word line and each column line of the first set of column lines and the second set of column lines comprises a digit line.

20. A memory device, comprising:
a memory array comprising a first set of column lines and a second set of column lines both extending in a first direction and a set of row lines extending in a second direction orthogonal to the first direction, wherein each row line of the set of row lines is coupled with a first set of memory cells that are coupled with the first set of column lines and a second set of memory cells that are coupled with the second set of column lines;
a set of sense amplifiers adjacent to the memory array in the first direction and extending over a first dimension in the first direction, wherein sense amplifiers of a first subset of the set of sense amplifiers are coupled with corresponding column lines of the first set of column lines and sense amplifiers of a second subset of the set of sense amplifiers are coupled with corresponding column lines of the second set of column lines, wherein the set of sense amplifiers are configured to read logic states stored in memory cells associated with a row line of the set of row lines based at least in part on an access operation for the row line; and
a counter adjacent to the set of sense amplifiers along the second direction and located within the first dimension in the first direction, wherein the counter is coupled with the second subset of the set of sense amplifiers via a set of conductive lines located within the first dimension of the first direction, the counter configured to track a quantity of access operations for the row line by incrementing a value based at least in part on the access operation for the row line, wherein, prior to incrementing the value, the value comprises the logic states read by the second subset of the set of sense amplifiers.

* * * * *